United States Patent [19]

Wilcoxen

[11] Patent Number: 5,059,556
[45] Date of Patent: Oct. 22, 1991

[54] LOW STRESS POLYSILICON MICROSTRUCTURES

[75] Inventor: Duane T. Wilcoxen, Williamsburg, Va.

[73] Assignee: Siemens-Bendix Automotive Electronics, L.P., Auburn Hills, Mich.

[21] Appl. No.: 494,828

[22] Filed: Mar. 16, 1990

Related U.S. Application Data

[63] Continuation of Ser. No. 250,055, Sep. 28, 1988, abandoned.

[51] Int. Cl.$^5$ ........................................ H01L 21/44
[52] U.S. Cl. ............................. 437/200; 437/201; 437/901; 437/921; 437/927; 357/26; 73/754; 73/777; 148/DIG. 73; 148/DIG. 159
[58] Field of Search ............... 437/200, 201, 901, 921, 437/927; 357/26; 73/715, 719, 754, 777, 861.97; 148/DIG. 73, DIG. 159

[56] References Cited

U.S. PATENT DOCUMENTS

| | | | |
|---|---|---|---|
| 4,528,582 | 7/1985 | Cohen et al. | 357/51 |
| 4,581,676 | 4/1986 | Baxter et al. | 73/718 |
| 4,665,610 | 5/1987 | Barth | 29/580 |
| 4,753,709 | 6/1988 | Welch et al. | 156/643 |

FOREIGN PATENT DOCUMENTS

WO86/06877 7/1986 PCT Int'l Appl. .

OTHER PUBLICATIONS

Muraka "Refractory Silicides for Integrated Circuits", J. Vac. Sci. Technol. 17(4) Aug. 1980, 775–792.
Collins et al., "Tantalum and Cobalt . . . ", Applied Physics A40 (1986) Jun. 16, No. 1 35–49.
Muraka "Codeposited Silicides . . . ", 2194 Thin Solid Films, 140 (1986) Jun. 16, No. 1, 35–49.
Suguro et al., "Impurity Effect on . . . ", Japan Soc. of Appl. Physics, 434–436.
Wolf et al., *Silicon Processing for the VLSI Era*, vol. 1, Lattice Press, Inc., Sunset Beach, CA (1986), pp. 390–394.
Lee et al., "Silicon Micromachining Technology . . . ", SAE Technical Papers, pp. 1–10.
Allan, Roger, "Sensors in Silicon", High Technology/Sep. 1984, pp. 43–77.

*Primary Examiner*—Olik Chaudhuri
*Assistant Examiner*—G. Fourson
*Attorney, Agent, or Firm*—Nixon & Vanderhye

[57] ABSTRACT

Method for relieving stress in silicon microstructures by forming a silicide on the microstructures. Sensors comprising a stress-relieved silicon microstructure are also described.

14 Claims, 2 Drawing Sheets

LOW STRESS POLYSILICON MICROSTRUCTURES

This is a continuation of application Ser. No. 07/250,055, filed Sept. 28, 1988, now abandoned.

FIELD OF THE INVENTION

The present invention relates to a method for relieving stress in silicon microstructures by the use of silicides and to microstructures comprising low stress silicon.

BACKGROUND OF THE INVENTION

In recent years, there has been a rapid growth in the application of silicon-based electronics systems, especially for automotive applications. The silicon-based electronics are used to store control algorithms, process information, and to direct actuators to perform various functions, including steering, suspension, and display of driver information, to name but a few. While the electronics revolution unfolds, sensor technology, on the other hand, is lagging behind, and sensor designs continue to be based on dated technologies with associated limitations. Recent trends have identified silicon as a material well suited for future sensor technology which hopefully will close this technology gap and permit greater application of control systems utilizing sensor technology.

Existing control systems use silicon-based electronics, and nearly all have embedded microprocessors. Silicon is widely recognized in the industry as being suitable for this application in view of its high reliability, high strength and low cost. In addition, silicon sensor designs can be created using a variety of manufacturing processes one of the most promising of which is referred to as "micromachining" which uses chemical processes to introduce three-dimensional mechnical structures in silicon. These "microstructures", as they are called, can be made sensitive to specific physical phenomena, such as acceleration, gas flow rate or pressure, by taking advantage of the special piezo resistive properties of silicon. For example, a micromachined cantilivered beam produces a minute resistance change when flexed by the force of acceleration. However, the output signal from this micromachined sensor is very small (millivolts), so that additional electronic circuitry is necessary for signal conditioning and amplification. These electronic circuits are usually integrated circuit chips which are interconnected to the micromachined element. Different aspects of micromachining are reviewed in Lee et al, "Silicon Micromachining Technology for Automotive Applications", SAE Publication No. SP655, Feb. 1986, and the content of that publication is hereby incorporated by reference.

A disadvantage associated with polycrystalline silicon is that it is known to have an inherent high compressive stress. For example, undoped crystalline polysilicon has a stress of the order of $-5 \times 10^9$ dyne/cm$^2$. This high compressive stress is disadvantageous especially when polysilicon is used for the fabrication of free-standing microstructures, such as cantilivers or bridges, which must be mechanically stable and not buckle or break. Such structures must have a low level of stress in order to facilitate the formation of free-standing structures of sufficient dimension to be useful as sensing elements. In a typical polysilicon deposition process used widely in the fabrication of integrated circuits today, silane gas is injected into a process tube at low pressure and a temperature of approximately 625° C. These processing conditions produce a very uniform layer of deposited polysilicon material on a substrate. However, thermal coefficient of expansion differences of the polysilicon layer and the underlying material will produce a net compressive force in the polysilicon and this gives rise to the disadvantages noted earlier.

Recently, there has been much research into methods for producing stress-free polysilicon. These methods have primarily been to deposit the silicon at a temperature that will produce an amorphous silicon film having little or no crystalline structure present. There have been other attempts to anneal the polysilicon in different ways to relieve the stress. All of the prior methods suffer from the disadvantage that they change the polysilicon deposition parameters and utilize high temperatures (i.e. above 600° C.), and so are incompatible with current technology trends and processing methods. In particular, the use of high temperatures for annealing and other processing is precluded because of the potential heat damage to the electronic components.

SUMMARY OF THE INVENTION

It has now been found, according to the present invention, that it is possible to achieve satisfactory stress relief in micromachined structures using low temperature technology (i.e. at 500° C. and lower) which is very advantageous in the production of integrated sensor structures. The methodology of the present invention has little or no effect on the processing parameters of the polysilicon deposition, thereby making the methodology more compatible with current processing methods.

The underlying concept of the present invention is to utilize a stress modifying material in conjunction with the material used to fabricate the microstructure to form a modified stress-relieved microstructure, in which the total stress level of the resulting combined microstructure is modified. This stress modifying material should have a stress force which is in the opposite direction (i.e. have an opposite sign) to that of the microstructure material, so that the stress level in the stress-modifying material and the microstructure material essentially cancel each other out and produce a resultant overall low stress level for the combined microstructure. It has been found, according to the present invention, that silicides have this property and can be formed at low temperatures of 500° C. or lower on the surface of the microstructure material to reduce the overall stress of the microstructure.

Thus, according to one aspect of the present invention, there is provided a method of relieving stress in a semiconductor substrate, which comprises forming a silicide on the substrate. According to another aspect of the present invention, it has been found that silicidation is effective to relieve inherent stress present in polysilicon micromachined structures. Particularly good results have been obtained by forming a layer of platinum silicide on such polysilicon microstructures.

According to a yet further aspect of the present invention, there is provided a sensor comprising a substrate and a microstructure formed on the substrate, with that structure having a silicide formed thereon for relief of stress in the structure. Preferably, the substrate is polycrystalline silicon, and the silicide is platinum silicide.

The silicide is usually formed by bringing a metal capable of forming a silicide into contact with silicon, for example polysilicon, and sintering at high temperature not higher than 500° C. to form the silicide. The metal may be selected from a refractory metal capable of forming a silicide, for example titanium, tungsten, molybdenum, tantalum and chromium. Alternatively, the metal may be a noble metal capable of forming a silicide, for example platinum or palladium. The preferred silicide for relieving stress in silicon substrates is platinum silicide.

Silicides of different metals have different stress levels, and different overall stress levels are produced in the microstructure by different thicknesses of silicide on the microstructure. Thus, by choosing appropriate silicides and thicknesses of the silicide layer it is possible, according the present invention, to fabricate free-standing microstructures, such as bridges and cantilevers, having dimensions which are large enough to be useful as a sensing element, while having a sufficiently low level of tensile stress that they do not buckle or collapse, and therefore effectively function as a sensor element.

The stress of the resulting combined free-standing microstructures is typically not more than $10 \times 10^9$ dyne/cm$^2$. More usually, the stress is in the region of $10 \times 10^7$ to $15 \times 10^8$ dyne/cm$^2$, preferably $8 \times 10^8$ to $10 \times 10^8$ dyne/cm$^2$. Examples of typical sensors which can be fabricated according to the present invention are mass air flow sensors (MAFS), accelerometers, and pressure sensors. However, it will be understood that the invention is not limited to the type of sensor, and can be used to relieve inherent stress in microstructures employed in any device or situation.

BRIEF DESCRIPTION OF THE DRAWINGS

The invention will now be further described with reference to the accompanying drawings, in which.

DETAILED DESCRIPTION OF THE INVENTION

Figure 9:
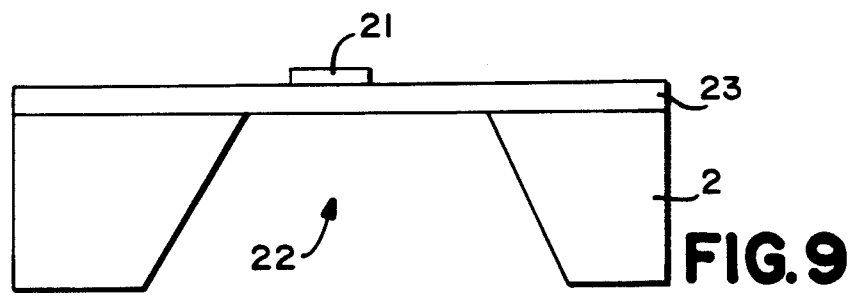
FIG. 9 shows a diaphragm structure formed by back-etching techniques.

Before discussing the invention in detail, it will be understood that, for the purposes of simplicity and ease of description and understanding, the invention will now be discussed with respect to the formation of a microstructure of an uncomplicated type on one side (the "top side") of a semiconductor substrate. It will be appreciated, however, that in a typical arrangement, there may be one or more integrated circuit components and one or more microstructures formed on the top side of the silicon substrate. It will also be appreciated that the present invention is equally applicable to structures formed by etching from the back side of the substrate such as is illustrated in FIG. 9.

Referring to FIGS. 1 through 8, there is shown a silicon substrate 2, typically in the form of a wafer, on which has been formed a silicon dioxide layer 4. The oxide layer (or sacrificial layer) 4 is formed by oxidizing the silicon substrate 2 at a temperature between 950° to 1100° C., typically a 1000° to 1050° C. for a period of about 3 to 6 hours, typically about 4 hours in the presence of steam. The process in which the silicon layer is formed is conventional, and well known to a person of ordinary skill in this art. The resulting silicon oxide layer is typically about 1 to 2 microns thick.

Figure 1:
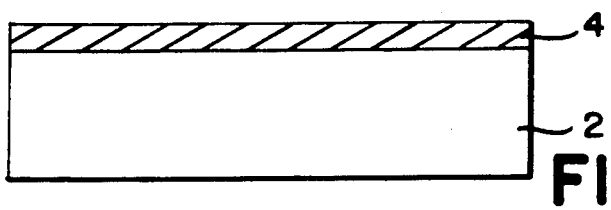
FIGS. 1 through 8 illustrate schematically the formation of a low stress microstructure according to the method of the invention.
Figure 2:
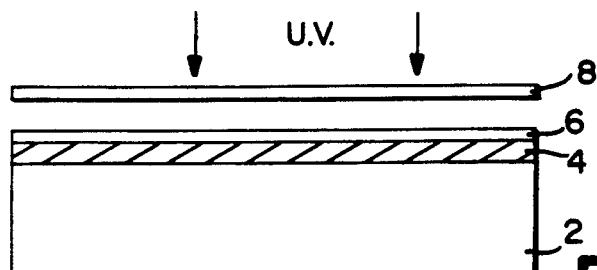

The oxide layer 4 is then etched using conventional photolithography techniques to produce an etched oxide layer. In this step, the oxide layer on the silicon wafer is coated with an emulsion 6 of a standard photoresist material and subjected to ultraviolet light through a mask 8 to define the desired pattern in the emulsion layer, as shown in FIG. 2.

Figure 3:
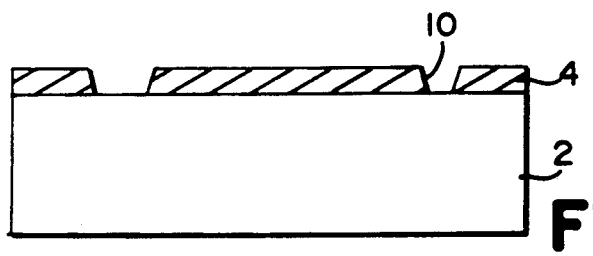

The configuration shown in FIG. 3 is produced by developing the exposed photoresist material according to conventional methodology. The etched layer 4 has windows 10 extending through to the silicon substrate.

Figure 4:
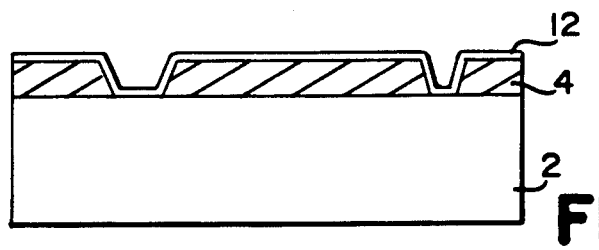

Polysilicon is then deposited at a temperature of between 580° to 700° C., preferably about 625° C. to form the structure shown in FIG. 4. The polysilicon is deposited using conventional technology in which pure silane is applied to the oxide layer 4 using low pressure chemical vapor deposition (LPCVD) at a pressure of about 200 to 400 mtorr, preferably at about 300 mtorr, over a period of 45 to 60 minutes, preferably for about 50 minutes. The thickness of the resulting polysilicon layer can range from 2000 to 10,000 Angstroms, and is typically in the region of 5,000 Angstroms.

Figure 5:
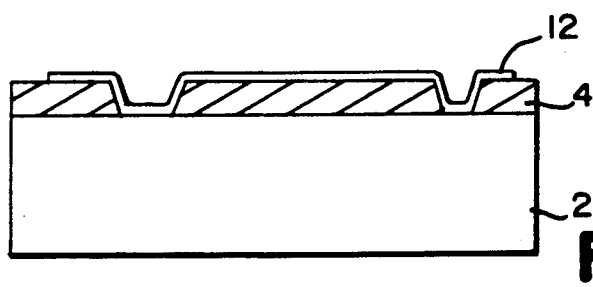

The polysilicon layer 12 is then etched to produce the structure shown in FIG. 5. If desired, it is possible to oxidise the layer 12 at about 850° to 1200° C. for 90 to 120 minutes to form an oxide layer which is then etched. Again, conventional etching techniques may be employed, such as, for example, reactive ion etching (RIE) using a mixture of carbon tetrachloride and oxygen at a pressure of about 80 to 100 mtorr for an etch time of about 10 to 20 minutes and at a power level of about 60 watts.

Figure 6:
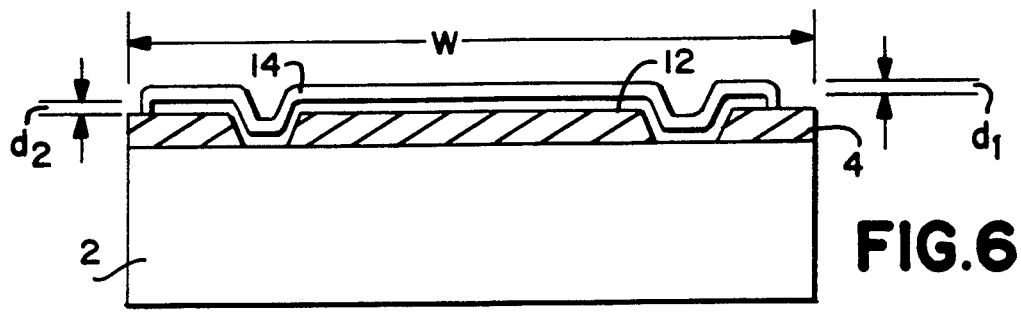

FIG. 6 shows the result of depositing a layer of platinum 14 onto the etched polysilicon layer 12. Platinum deposition is carried out using conventional techniques, such as, for example, by sputtering a platinum target utilizing bombardment with argon. The sputtering is ordinarily carried out at a temperature from about room temperature to about 300° C., for example about 200° to 300° C., usually at about 250° C., at a pressure of 10 to 40 mtorr, preferably at about 20 mtorr, and at a voltage of about 250 to 300 volts, typically around 280 volts. The thickness of the resulting sputtered platinum layer may range from 500 to 10,000 Angstroms, and is typically in the region of 1,500 to 2,000 Angstroms. The amount of platinum deposited may be calculated as described later to give a layer of sufficient thickness to achieve the desired balancing of stress in the ultimate silicided structure.

Figure 7:
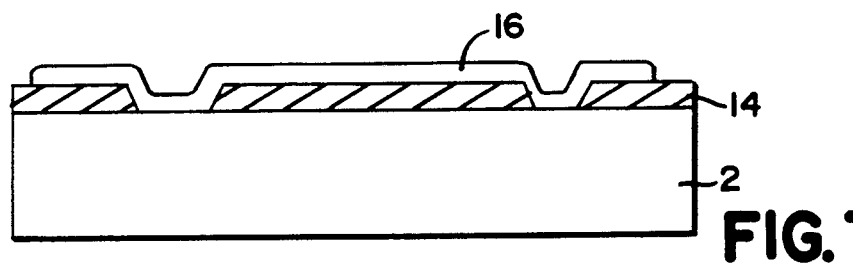

The wafer is then subjected to annealing at a temperature of 500° C. or less, typically at about 400° C., to form a platinum silicide layer 16 on top of the oxide layer 4 (see FIG. 7). The silicidation is carried out in an inert atmosphere, typically an atmosphere of nitrogen, for a period of about 45 minutes to 2 hours, typically for about an hour.

The remaining platinum not consumed in the silicidation is then stripped from the resulting annealed structure. Stripping may be carried out using conventional techniques, and is typically effected using an aqua regia solution of 11 parts water, 9 parts hydrochloric acid and 1 part nitric acid.

Figure 8:
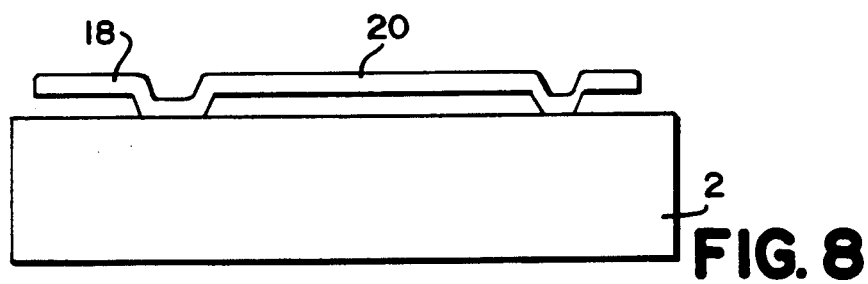

The sacrificial oxide layer 4 under the silicide layer 16 on the top side of the silicon substrate 2 is then etched away using a conventional oxide etch, for example hydrofluoric acid. Finally, rinsing with water or isopropyl alcohol completes the preparation of the desired microstructure as shown in FIG. 8 having the silicided polysilicon as a low-stress free-standing microstructure on the top side of the silicon substrate 2.

The method of the invention produces low stress microstructures which are free-standing, and do not collapse due to internal compressive forces. FIG. 8 shows free-standing cantiliver portions 18 as well as the bridge portion 20, all of which have a stress level such that they do not collapse or upwardly buckle.

The silicided microstructures formed according to the invention generally have a stress of not more than $10 \times 10^9$ dyne/cm$^2$, preferably not more than about $15 \times 10^8$ dyne/cm$^2$, preferably $10 \times 10^7$ to $10 \times 10^8$ dyne/cm$^2$. The stress of the microstructures of the present invention can be measured by techniques known to persons of ordinary skill in the art. In particular, the method described by Guckel et al, "A Simple Technique for the Determination of Mechanical Strain in Thin Films with Application to Polysilicon", J. App. Phys., 1671, 1985 may be used. The stress is then calculated from the strain measurements by way of Young's Modulus using known mathematical techniques. An alternative method for measuring the stress is to use a stress guage, such as the one supplied by Ionic Systems Inc. under the model number 30122. Such a guage measures the average stress across the wafer or across a section of the wafer.

FIG. 9 shows a diaphragm structure typically used for mass air flow sensor devices. The structure includes a low-stress heater/sensor microstructure element 21 silicided according to the present invention, and mounted on a diaphragm membrane 23, composed typically of oxide/nitride layers. The backside area 22 is formed by conventional backside etching techniques of the silicon layer 2. It is important to note that, irrespective of whether front side structures or structures formed by etching from the backside of the silicon substrate are involved, in both instances, the use of low temperature, (i.e. 500° C. or less, for example 150° to 450° C., typically 300° to 400° C.) facilitates the formation of low-stress microstructures, even in the presence of integrated circuit components on the wafer. The use of temperatures above 500° C. in the formation microstructures gives rise to the serious risk of thermal damage to the integrated circuit components on the wafer.

A further advantage associated with the formation of top side structures is that all the processing can be effected from one side of the wafer. In the embodiment shown in FIG. 9, sophisticated apparatus must be used to facilitate handling of the wafer while processing is carried out on both the frontside and the backside of the wafer.

Figure 10:
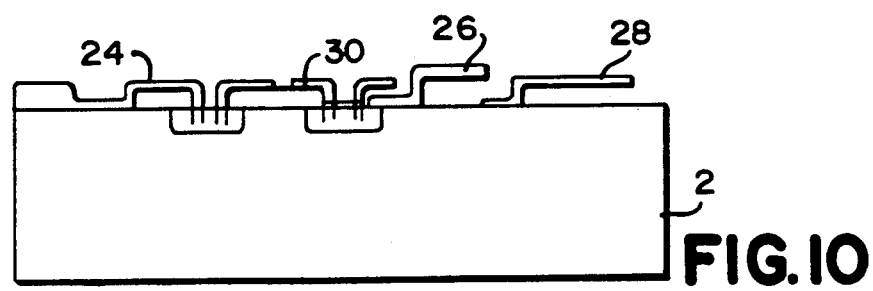
FIG. 10 shows an integrated silicon sensor having an integrated circuit and a low-stress top side microstructure.

The above advantages are particularly well illustrated in FIG. 10 which shows an integrated silicon sensor arrangement. The sensor includes integrated circuit components 24 on the left of the top side of the substrate 2, and microstructure components 26 on the right hand side of the top side. Silicidation of the microstructure facilitates the formation of low stress architecture which enables the cantiliver structure 28 and the bridge structure 30 to remain free-standing, and not to buckle or collapse due to internal compressive forces.

While not being bound to any theory, the following analysis is believed to facilitate an understanding of why the method of the present invention results in the formation of low stress microstructures. The following analysis is with reference to polycrystalline silicon silicided with platinum silicide, and makes the broad assumption that the stress forces of the silicide material and the polycrystalline silicon are in opposite directions (i.e. of opposite sign) and at the levels published in the literature. Based on those assumptions, the amount of platinum and of platinum silicide for a certain amount of polysilicon can be determined. This is illustrated below.

First, it will be assumed that the stress in the final structure is in the vertical plane only, and that the stress forces in each portion of the composite material are of the form:

$$\text{stress} = F/d.W = \tau$$

wherein F is the force due to the stress field, d is the thickness of the film and W is the cross-sectional width.

For a two-layer film (see FIG. 7), with each layer having the same cross-sectional width, but different thicknesses, the stress equation reads as follows:

$$\sigma_1 = F_1/d_1 W \text{ and } \sigma_2 = F_2/d_2 W$$

In order to balance the stress in the two layer material, the combined stress level of both layers must add to 0. Therefore:

$$\text{Stress Total} = F_1 + F_2 = 0 \text{ or}$$

$$\sigma_t = (\sigma_1 d_1 W + \sigma_2 d_2 W) = 0$$

$$\sigma_1 d_1 \sigma_2 d_2$$

$$d_1/d_2 = -\sigma_2/\sigma_1$$

Published values of typical stress levels of polysilicon and platinum silicide are:

$$\sigma_1 = 12 \times 10^9 \text{ dyne/cm}^2 \text{ for PtSi}$$

$$\sigma_2 = 5 \times 10^9 \text{ dyne/cm}^2 \text{ for polysilicon}$$

Then $d_1/d_2 = 0.417$

The formation of platinum silicide is known to have the requirement of about 1.3 Angstroms of silicon for each Angstrom of platinum, and will yield 1.97 Angstroms of platinum silicide for each Angstrom of platinum with a sufficient amount of polysilicon. For a balanced structure, this equates as follows:

$$P = FP + SP$$

$$d_1/d_2 = (1.97Pt)/(P + 1.3 Pt)$$

Where P=polysilicon thickness, FP is the final polysilicon thickness after silicidation, SP is the thickness of the silicide of the polysilicon and the Pt is the platinum thickness.

By use of the above equations, the thickness of the platinum required for a certain thickness of polysilicon that will produce a stress free film by formation of platinum silicide can be readily calculated. The deposited stress levels of each film must be determined in order to enable the calculation of the proper film thickness and the stress level of the resulting combined structure.

What is claimed is:

1. A method of producing a sensor having a free-standing low stress microstructure, said method of forming the microstructure comprising the steps of:

forming a layer of a metal selected from the group consisting of refractory metal and a noble metal on a substrate of polycrystalline silicon to give a metal-coated silicon layer; and sintering said metal-coated silicon layer at a temperature not higher than 500° C. in an inert atmosphere to cause formation of stress-relieving metal silicide.

2. A method according to claim 1, wherein said refractory metal is selected from the group consisting of titanium, tungsten, molybdenum, tantalum and chromium.

3. A method according to claim 1, wherein said noble metal is selected from the group consisting of platinum and palladium.

4. A method according to claim 1, wherein said metal silicide is platinum silicide.

5. A method according to claim 1, wherein said substrate is a top-side structure.

6. A method according to claim 1, wherein said sintering is carried out at a temperature of about 250° C. to 400° C.

7. A method according to claim 1, wherein said sintering is carried out for a period of about 45 to 60 minutes.

8. A method according to claim 1, wherein said stress-relieving metal silicided microstructure has an intrinsic tensile stress of not more than about $10 \times 10^9$ dyne/cm$^2$.

9. A method according to claim 8, wherein said stress is about $10 \times 10^7$ dyne/cm$^2$ to $15 \times 10^8$ dyne/cm$^2$.

10. A method according to claim 1, wherein said microstructure is a bridge structure.

11. A method according to claim 1, wherein said microstructure is a cantilever structure.

12. A method of producing a sensor having a free-standing low stress microstructure, said method of forming the microstructure comprising the steps of:

forming a layer of platinum on a substrate of polycrystalline silicon to give a platinum-coated silicon layer; and sintering said platinum-coated silicon layer at a temperature of about 250° C. to 400° C. in an inert atmosphere for a period of about 45 to 60 minutes to cause formation of a stress-relieving platinum silicide.

13. A method according to claim 13, wherein said polycrystalline silicon is formed by low pressure chemical vapor deposition of silicon tetrahydride on said substrate.

14. A method according to claim 13, wherein said layer of platinum is formed by sputtering platinum on said polycrystalline silicon layer.

* * * * *